United States Patent [19]

Stoesser et al.

[11] 3,973,256
[45] Aug. 3, 1976

[54] KEY DETECTION SYSTEM INTERCONNECTING KEYBOARD AND DATA PROCESSING SYSTEM

[75] Inventors: Wolfgang R. Stoesser, Santa Susanna; Connable F. Wills, Venice; Irving Sperling, Santa Monica, all of Calif.

[73] Assignee: Compucorp, Los Angeles, Calif.

[22] Filed: July 14, 1975

[21] Appl. No.: 595,510

[52] U.S. Cl............................ 340/365 E; 340/365 S
[51] Int. Cl.²........................................... G08C 1/00
[58] Field of Search ............................... 340/365 E

[56] References Cited
UNITED STATES PATENTS
3,825,926  7/1974  Brownback ..................... 340/365 E Primary Examiner—Thomas B. Habecker
Attorney, Agent, or Firm—Lindenberg, Freilich, Wasserman, Rosen & Fernandez

[57] ABSTRACT

A system is disclosed for scanning a keyboard and detecting any depressed key during each scan cycle, and for filtering out any bounce in key contacts closing and opening with a filtering up-down counter that counts up each scan cycle that the same key is found, down each cycle that a different key is also found or that no key is found, and requiring that the filtering counter reach a selected maximum before finding that a key is depressed and that the filtering counter reach zero before starting to filter another key detected to be depressed.

10 Claims, 6 Drawing Figures

SCANNING SECTION
OF SCANNER-FILTER
FIG. 3

FILTERING SECTION
OF SCANNER-FILTER

FIG. 4

A  SPURIOUS CONTACT CLOSURE
   (NO KEY ACTIVE)
   0 0 0 1 2 1 0

SET KEY ACTIVE      RESET KEY ACTIVE
B    KI        KI                        
   0 0 0 1 2 1 0 0 0 1 2 3 3 - - - 3 3 2 1 0 0

KEY DETECTION SYSTEM INTERCONNECTING KEYBOARD AND DATA PROCESSING SYSTEM

BACKGROUND OF THE INVENTION

This invention relates to data processing systems and more particularly to interconnection of a data processor and the keyboard of a peripheral device.

In a data processing system, the data that is processed is transferred into and out of the system through peripheral devices, such as magnetic tape or disc devices, card read or card punch devices, typewriters and control console. A typewriter, or a keyboard at the control console, is often used to manually enter data or instructions. The central processing unit (CPU) senses when a key has been depressed and takes appropriate action to interrupt the processing of data while a code identifying the key is read in.

A problem arises in properly identifying the key when the operator either depresses two keys in overlapping time or has so depressed one key that the key contacts bounce. It has been the practice of the industry to employ keyboards so designed as to eliminate the bounce problem, but the cost of such keyboards is significantly higher. The other problem, which may be referred to as a "key rollover" problem, could perhaps also be solved by a keyboard design having an interlock system which will not permit the second key contacts to make until the first key contacts break. However, such a solution of the rollover problem would make the cost of the keyboard too high for general use in low cost data processing systems. Therefore, it is an object of this invention to provide an improved key identifying system. Another object of the invention is to provide a key-bounce filtering system to eliminate double entry of a single key depressed once. Still another object is to provide a system for identifying in sequence two keys depressed in overlapping succession.

SUMMARY OF THE INVENTION

In accordance with the present invention, a keyboard is coupled to a CPU in a data processing system by a scanner which continually scans the contacts of individual keys of a keyboard in a fixed sequence using a free running counter to scan so that the state of the counter at the time closed key contacts are found will uniquely identify the key depressed. The state or number of the key is compared with the contents of a buffer. If the comparison is negative, as it will be upon initial operation of a key, the key number is transferred to the buffer. If it is positive, as it normally will be on subsequent scans, the transfer is not made. Instead, an up-down counter is enabled to count up. After a predetermined number of successive scan cycles have resulted in a positive comparison, the up-down counter reaches a maximum and an interrupt signal is transmitted to the CPU, thus indicating that a depressed key has been found. The content of the key buffer is then read into the CPU. The up-down counter remains at the maximum until a scan cycle fails to detect a key depressed. It then counts down by one for each time no key is found depressed. If a second key is found depressed while the up-down counter is counting up, but before the up-down counter reaches the predetermined maximum count, the up-down counter will not count up. Therefore a minimum number of scan cycles must be completed with only one key depressed before a second key is depressed. If no key is found, or if a second one is found depressed in the same scan cycle, the up-down counter will count down. After the predetermined number of such cycles have been counted down, the process of scanning and filtering for a new key is started over again. In the case of overlapping keys, when the first key is no longer depressed, the remaining key depressed is found as though it were a single key just then depressed. The filtering system thus separates overlapping keys, and requires that the second depressed key follow the first by more than a predetermined minimum number of scan cycles.

The novel features that are considered characteristic of this invention are set forth with particularity in the appended claims. The invention will best be understood from the following description when read in connection with the accompanying drawings.

DESCRIPTION OF THE PREFERRED EMBODIMENTS

General Description

Figure 1:
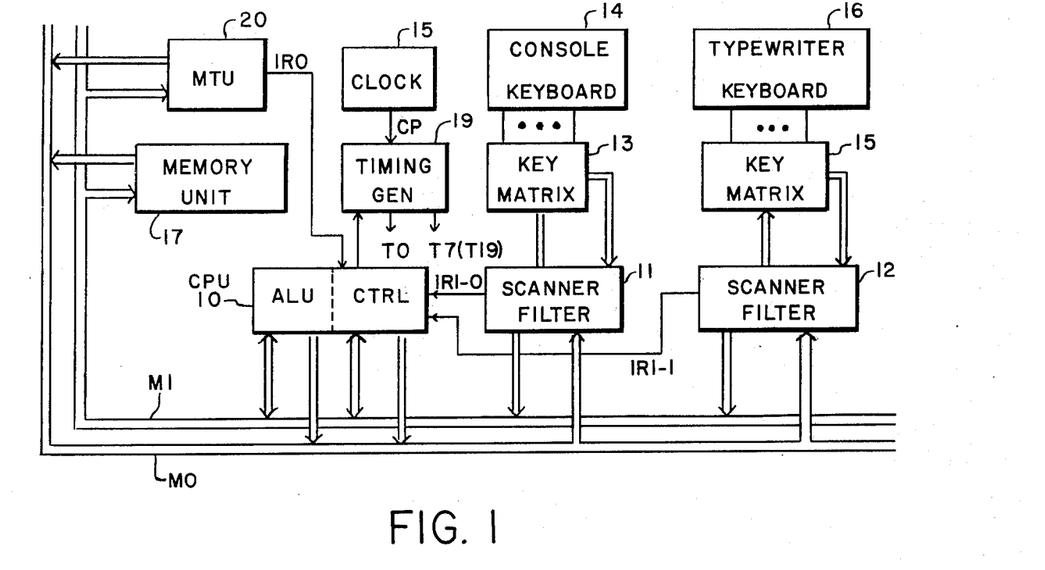
FIG. 1 illustrates a data processing system embodying the present invention.

An exemplary data processing system embodying the present invention is illustrated in FIG. 1. It includes a central processing unit (CPU) 10 having at least a control section (CTRL) and an arithmetic logic unit (ALU), and two scanner-filters 11 and 12, one for scanning and filtering a key matrix 13 for a console keyboard 14, and one for scanning and filtering a key matrix 15 for a typewriter 16.

The CPU is configured around two data buses, designated memory input, MI, and memory output, MO, which transmit data into and out of memory in parallel, for example in 4-bit parallel groups. The MO data bus provides the path for the transfer of data and instructions to the CPU from a memory 17. The MI data bus permits data to be transferred from the CPU to the memory during the memory cycle. Both program codes and data are stored in the memory, such as in words of 8-bit multiples. The basic system cycle requires 40 microseconds or 8 bit times of a 5 microsecond clock from a source 18. The first 4 bit times are required to fetch the next instruction and perform control functions. The last 4 bit times are required to execute that instruction. An extended cycle of 20 bit times is required when operating on more than 16 bits. In this extended cycle, 4 bit times are used for control and 16 bit times for the execution of the instruction. Sometimes, depending on the instruction and the data, multiple cycles of 8 and 20 bit times may be grouped together to execute one instruction. Thus a normal cycle is eight clock times, T0 – T7, while an extended cycle is twenty clock times, T0 – T19. A timing generator 19 generates all timing signals as required by the control section for distribution where needed over bus lines not shown.

There are three interrupt levels, the lowest for input-output devices, such a magnetic tape unit (MTU) 20, the highest for printers, and the intermediate priority for keyboard scanners. The CPU can, under programmed instruction control, disable all interrupts.

Figure 2:
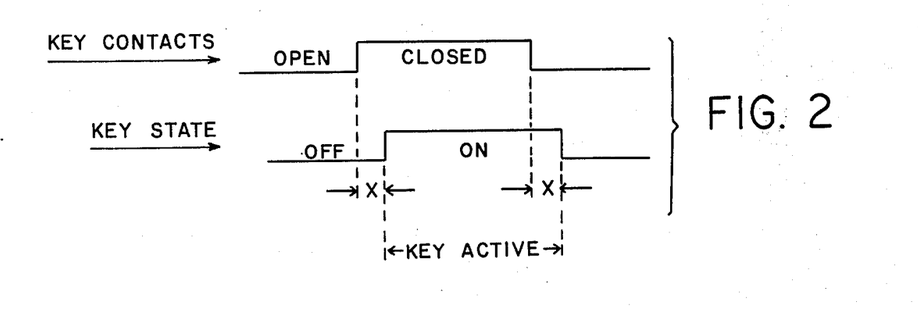
FIG. 2 is a timing diagram generally illustrating the bounce filter time of a scanner-filter in the system shown in FIG. 1.

In the case of an interrupt request from a scanner filter, it should be noted that when a key is depressed, the key does not become electronically active in the system for X milliseconds, and remains active for X milliseconds after the key is released, as shown in FIG. 2. This is due to the bounce filtering function of the scanner filter in accordance with the invention. In a preferred embodiment, the filter time X can be specified under programmed control of the CPU.

During the leading filter time, any contact bounce is permitted to subside in order to make positive identification of an active key. During the trailing filter time, there is effective separation of a succeeding key depressed in overlapping time with the presently active key. Such overlap should not, however, occur within the first filter time because under that condition the scanner-filter assumes both were depressed at substantially the same time and, not being able to reliably determine which was intended to be first, will reject both. Once an active key is found, an interrupt request signal is transmitted by the scanner-filter involved, IRI-0 from one and IRI-1 from the other.

Immediately upon responding to an interrupt request, the CPU transmits a 4-bit instruction to command the request to be turned off through an instruction decoder which is first addressed by a 4-bit code in the scanner-filter and thereby made to uniquely respond to the command. A separate interrupt request line to the CPU is shown for each scanner-filter to enable the CPU to determine the source directly, but in practice all interrupt request signals may be transmitted to the CPU through a common bus line, including interrupt requests IR0 from the MTU. The CPU would then respond to any interrupt by a subroutine to scan and determine which has an active interrupt starting in the order of priority. In any case, the detected key number is read into the CPU with an input-data instruction, IPDB addressed to the scanner being serviced. Buffer storage of keyed data is then carried out within the CPU.

Figure 3:
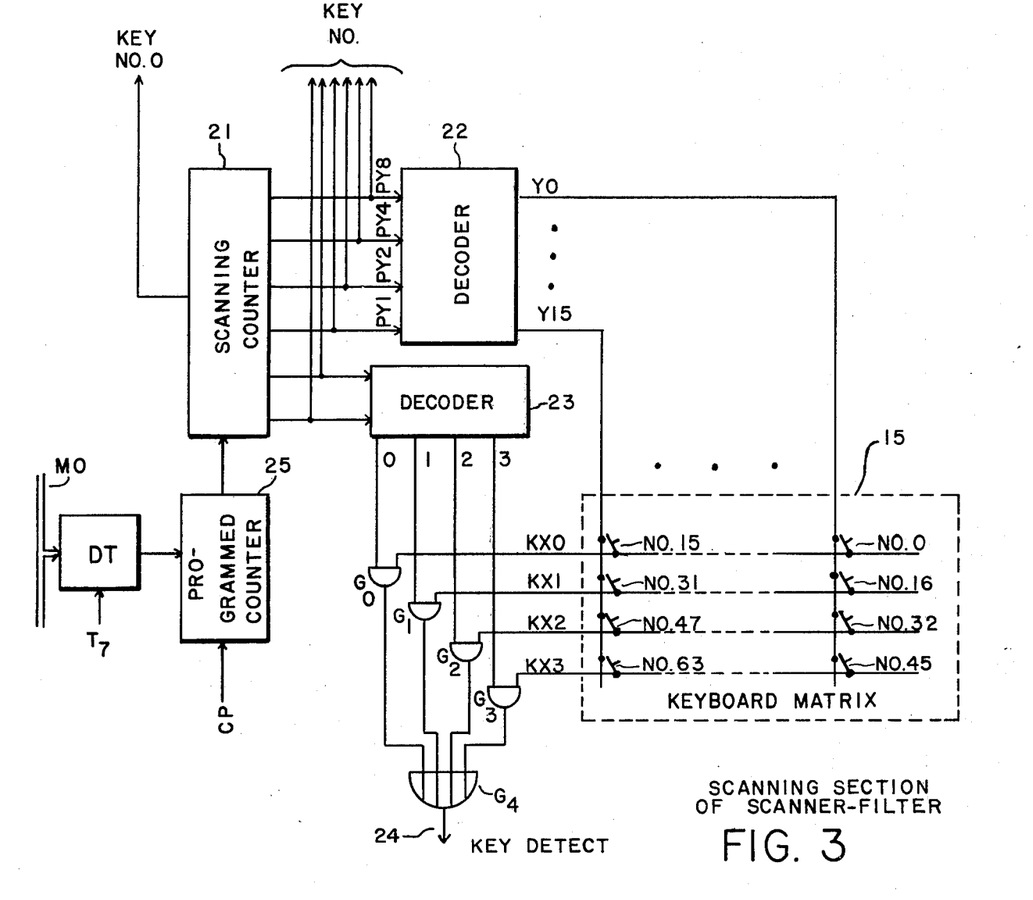
FIG. 3 is a schematic diagram of the scanning section in a scanner-filter of the system shown in FIG. 1.

Scanning Section (FIG. 3)

Each scanner-filter can identify up to 64 keys connected to a sixteen-by-four key matrix in an exemplary arrangement shown in FIG. 3 for the key matrix 15. The matrix is comprised of four horizontal buses KX0 through KX3 and 16 vertical buses Y0 through Y15. The vertical buses are continually energized in sequence by a 6-bit counter 21 through a decoder 22 connected to the four most significant four bits of the counter. A decoder 23 decodes the two least significant bits of the counter in order to enable AND gates $G_0$ through $G_3$ in sequence. The outputs of the gates are connected to a line 24 by an OR gate $G_4$ to signal when a key is depressed. In that manner the horizontal lines are sequentially coupled to the line 24, and while each is thus coupled out, all the vertical lines are sequentially energized by the output of the decoder 22. No signal is coupled to the line 24 unless a key is depressed to connect a vertical line in the matrix to a horizontal line. The signal called KEY DETECT occurs only during the period a particular vertical line is energized. The state of the counter during a KEY DETECT signal period uniquely identifies the key depressed.

The KEY DETECT signal could be used to gate the state of the counter 21 into a buffer, and to simultaneously request an interrupt, but according to the present invention, the KEY DETECT signal is filtered to eliminate false multiple key inputs from a single key depressed due to contact bounce, to suppress any key input due to simultaneous operation of more than one key, and to assure that a subsequent key depressed in overlapping time will be recognized and produce a separate key input. That is accomplished by the filtering section of a scanner-filter fed signals by the scanning section as just described with reference to FIG. 3.

Before describing the filtering section, it should be noted that one complete matrix scanning cycle consists of the counter 21 counting 64 clock pulses (i.e. counting from 0 to 64). The next clock pulse (CP) recycles the counter to zero, thus energizing the vertical line Y0 again while the horizontal line KX0 is coupled to the line 24 through gate $G_o$. That starts a new cycle to sample the state of key No. 0 identified by the unique binary code 000000. Consequently the clock pulse rate determines the scanning rate. The clock pulse rate can be divided by a programmed counter 25 set to divide by a predetermined number, such as by eight, for a slower scan rate.

Figure 4:
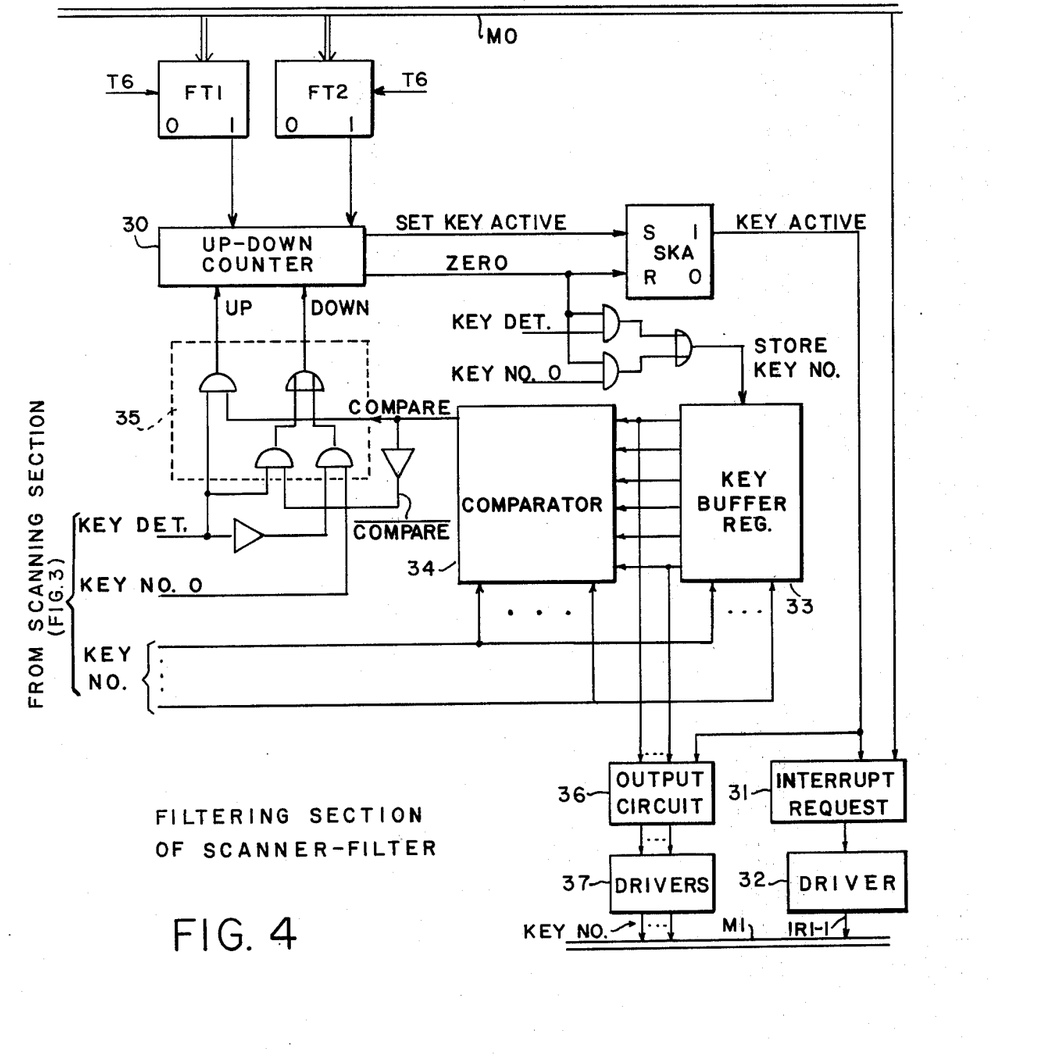
FIG. 4 is a block diagram of the filtering section in a scanner-filter of the system shown in FIG. 1.

Filtering Section (FIG. 4)

A more direct control of the filter time X shown in FIG. 2 is exercised by the CPU through the execution of programmed instructions which set filp-flops FT1 and FT2. They control the upper level to which an up-down counter 30 will count up in response to KEY DETECT signals received from FIG. 3 and recognized by the filtering section in a manner to be described. Through this control, the maximum (upper) level selected may be 1, 3, 5 or 7. The counter always counts down to zero as the lower level in response to KEY DETECT signals received but not recognized, or in response to a scan cycle completed without even generating a KEY DETECT signal.

When the upper level is reached, a SET KEY ACTIVE signal is transmitted to set a flip-flop SKA, thus setting a KEY ACTIVE signal which enables an interrupt request circuit 31 to transmit an IRI signal through a driver 32. The CPU picks up the IRI signal and acts on it as described with reference to FIG. 1. The dash-0 and dash-1 notation for the IRI-0 and IRI-1 signals merely denotes the source of the IRI signal.

The function of the counter 30 is to filter the KEY DETECT signal received from the scanner section shown in FIG. 3. For example, if the upper level for the counter is set to three, that level must be reached before the KEY ACTIVE signal can be set. If the contacts of a depressed key bounce, the counter will alternately count up when the contacts make and down when the contacts break. As a consequence, the level of three cannot be reached until contact bouncing stops to permit the necessary number of successive counts up. The trailing end of key depression is similarly filtered because the counter must count down to zero in steps through three cycles that a KEY DETECT signal is generated, but not recognized, or a KEY DETECT signal is not generated. This filtering action will be described more fully with reference to FIG. 5.

The filter section of a scanner filter will also provide what may be called a "rollover" capability. Once a key is found depressed, the KEY ACTIVE signal is set as just described, and will remain set as long as the key remains depressed to indicate the key detected is still active. when another key is depressed while the first key is still depressed, the second key will not cause another KEY ACTIVE signal to enable another interrupt request until the first key is released and any bounce in the contacts of the released key is filtered out. If only the filtering function were implemented as described so far in general terms, the overlap between the two keys could cause the scanner-filter to fail to recognize the second key, thus causing an error in the keying of data. To avoid that, the filtering section is so implemented that after the first key is released, the second key will be filtered and will then initiate an interrupt request. If another key is depressed in overlapping relationship with the second key, the system again permits the next key to similarly become active after the second key is released, and so on in an endless chain of overlapping keys. This rollover capability will be described more fully with reference to FIG. 6.

A description of the filtering section will now be completed with reference to FIG. 4. Each time a KEY DETECT signal is generated, the state of the scanning counter 21 (FIG. 3) is compared with the contents of a key buffer register 33. Initially the content of the buffer will be a bit 0 in each of 6 bit positions. In practice, the comparison is being made continuously by a static comparator 34, but its output COMPARE is sampled only when a KEY DETECT signal is present through a logic network 35. The logic COMPARE · KEY DETECT causes the counter 30 to count up by one. The logic $\overline{\text{COMPARE}}$ · KEY DETECT causes the counter to count down by one. The logic $\overline{\text{KEY DETECT}}$ · KEY NO. 0 will also cause the counter to count down by one, where KEY NO. 0 is generated by decoding the zero state of the scanning counter 21.

Whenever the counter 30 is at zero, it enables the key buffer register 33 to store the content of the scanning counter each time a KEY DETECT signal is generated, or each time a scanning cycle is completed according to the logic ZERO (KEY DETECT + KEY NO. 0), where ZERO is a signal generated by decoding the zero state of the filtering counter 30. Thus, while the keyboard is not in use, the buffer is continually being loaded with the binary number 000000 at the end of each scanning cycle because the filtering counter will be at zero. As soon as the keyboard is put into use by depressing a key, a KEY DETECT signal will be generated during the next scanning cycle. If the key depressed was No. 0, a count up command is generated by the logic COMPARE · KEY DETECT. Assuming no contact bounce, after the upper level is reached by the filtering counter, a SET KEY ACTIVE signal is generated to set the flip-flop SKA which transmits a KEY ACTIVE signal to the circuit 31 to transmit an interrupt request. The KEY ACTIVE signal also enables a circuit 36 to transmit the content of the buffer to a set of drivers 37. If there is contact bounce, each scanning cycle which fails to produce a KEY DETECT signal will cause the filtering counter 30 to count down by the logic $\overline{\text{KEY DETECT}}$ · KEY NO. 0. If the key depressed was other than No. 0, the comparator will generate a COMPARE signal at the time a KEY DETECT signal is present, and will command the filtering counter to count down. However, the filtering counter is not permitted to count below zero. The KEY DETECT signal will then cause the new key number to be stored in the buffer 33 according to the logic ZERO · KEY DETECT.

In practice, the scanner-filter is a synchronous system which obtains its basic timing from the generator 19 (FIG. 1). Since both the scanning counter 21 and the filtering counter 30 are synchronous counters, the count command is effectively made at the end of a KEY DETECT signal. Also the transfer of a key number is simultaneously made at the end of the KEY DETECT signal.

Once a new key number is transferred into the buffer, the filtering function of the scanner filter commences. The comparator continually compares the state of the scanning counter 21 with the state of the buffer. If it generates a COMPARE signal while a KEY DETECT signal is present, the filtering counter 30 is commanded to count up. Assuming no bounce in the key contacts, after the selected number of scanning cycles, a SET KEY ACTIVE signal is transmitted by the filtering counter upon reaching the selected upper level. If a bounce is present, no KEY DETECT signal will be generated in a subsequent scanning cycle so the filtering counter will be commanded to count down by one, thus interrupting the advance of the counter to the selected upper level. Once the counter reaches the selected upper level set through the flip-flops FT1 and FT2 as described hereinbefore, it will remain there as long as the key continues to be depressed. During that time, the CPU will respond to the interrupt request.

The KEY ACTIVE signal set upon detecting and filtering a depressed key is the signal that effects transfer of the key number to the CPU from the buffer. The respective circuits 31 and 36 code the interrupt request and key number onto the memory input (MI) bus used as a communication line for control information to the CPU during a certain time of the CPU and as a communication line for data to the CPU during other times. The memory output (MO) bus is used as a communication line for control information from the CPU, such as selection of the filteriing time.

In an exemplary embodiment, there are 4 bit times of each instruction memory cycle in the CPU when the processor does not access memory itself. Assuming a 4-bit parallel system there are actually 16 bits of control information or data that can be multiplexed onto the MI and MO buses. During one of these 4 bit times, the circuit 31 is active to place an interrupt request signal on the MI bus. During two of the 4 bit times, the circuit 36 is active to place the 6-bit key number on the bus, first 4 bits and then the remaining 2 bits. The circuits 31 and 36 repeat the process every instruction cycle of the CPU.

A requirement of this exemplary system is that the CPU respond quickly to an interrupt request because once the key is released, the key number of that key may no longer be in the buffer. Once the interrupt request is serviced, the circuit 31 is reset by a CPU command RKEY to terminate multiplexing an interrupt request onto the MI bus. The circuit 31 will not be made active again until the flip-flop SKA has been reset by ZERO and again set when another key is found.

The time that a depressed key is released is also filtered because key contact bounce may occur then also. For instance, if the key contacts should again make after they break, and the counter starts counting down, a COMPARE signal may occur to cause the counter to count up again, but a new KEY ACTIVE signal will not be transmitted since the SKA flip-flop will remain set until a ZERO signal from the filtering counter resets it.

The filtering function of the up-down counter 30 will now be described with reference to FIG. 5. It is assumed the filter time X is set for a count of three by the control signals FT1 and FT2. In the first graph A a first key, K1, will be found during each scanning cycle to increment the filtering counter by one during each cycle that the key was found. In this case, the key is found for only two subsequent scanning cycles. Consequently, the filtering counter reaches only the count of two before failure to find the key causes it to count down, again by one during each cycle that the key is not found. After two cycles during which the key was not found, the filtering counter again reaches the count of zero and a SET KEY ACTIVE signal is not generated. In that manner, the short spurious closing of key contacts for a period shorter than the selected period of three scanning cycles is prevented from generating a false indication that a key was depressed.

Figure 5:
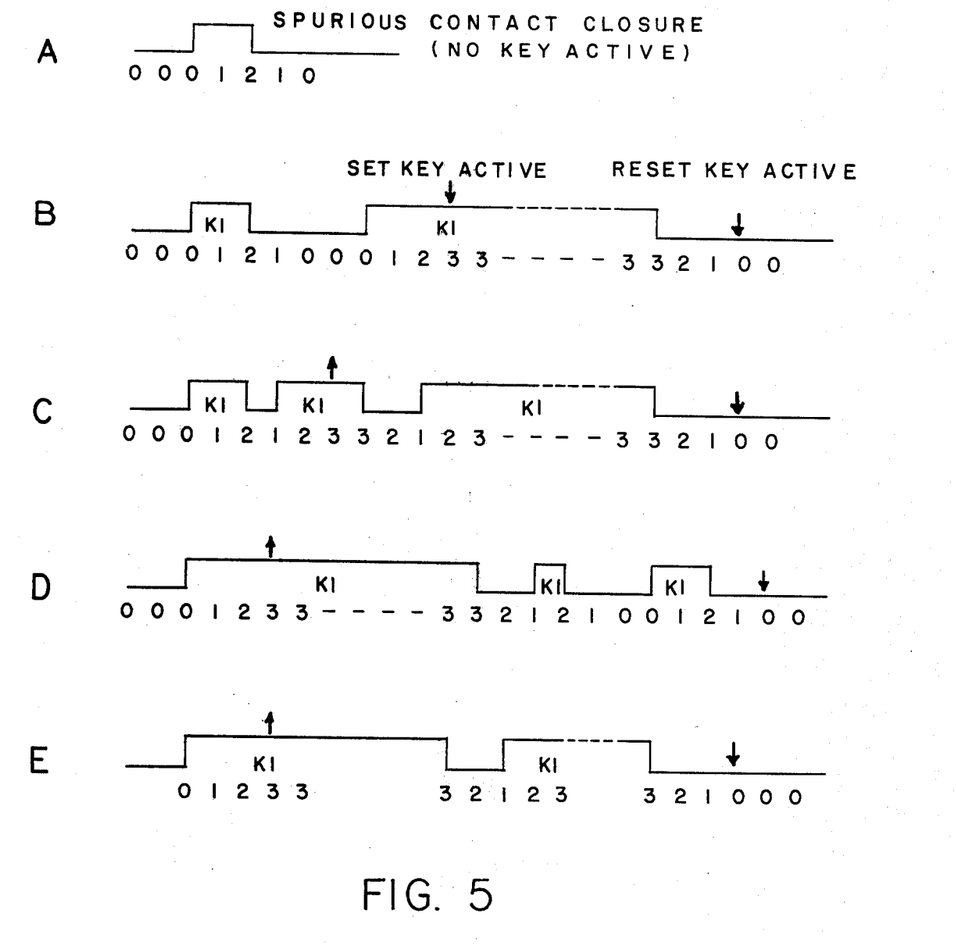
FIG. 5 shows graphs that illustrate the filtering function of a scanner-filter operating in accordance with the present invention.

The next two graphs B and C of FIG. 5 illustrate a leading bounce in the operation of a first key, K1, after the filtering counter has counted down to zero. In the case of graph B, the key contacts again close for a count of two in the filtering counter 30 and the key is not again found for a number of cycles greater than two permitting the filtering counter to count down to zero. There it remains until the key is again found. Assuming the key contacts have now settled, the filtering counter proceeds to count up to the preselected maximum of three during successive scanning cycles in which the same key is found. Once the filtering counter reaches the count of three, a SET KEY ACTIVE signal is generated. Once the key is released, the filtering counter proceeds to count down from three to zero.

In the case of graph C, a double bounce in the key contacts is illustrated. In the first bounce, the filtering counter counts to two. When the key is not found in the next cycle, it counts back down to one. Then the key contacts again close, permitting the filtering counter to resume counting up from the count of one to a count of three after only two successive scanning cycles during which the same key is found. At the count of three, the SET KEY ACTIVE signal is generated, but after one more scanning cycle, the key is again not found, and the filtering counter begins counting down to zero. In one scanning cycle, it counts down to a count of two and during a subsequent scanning cycle it counts down to a count of one. In the next scanning cycle, the same key is again found so the filtering counter resumes counting up, reaching the maximum count of three and remaining there as long as the key is depressed. It then counts down to zero after three successive cycles during which the key is not found. In that manner, a double bounce has produced a single KEY ACTIVE signal, thus preventing double entry of the same key. The key contacts must be open and remain open for three successive cycles in order for a zero output from the filtering counter to reset the KEY ACTIVE SIGNAL.

The next two graphs D and E of FIG. 5 illustrate the filtering function of the counter 30 at the trailing end of an active key. In graph D, it is assumed that there was not a leading bounce in the key contacts, or that any leading bounce has been filtered out in the manner described with reference to graphs B and C. Then when the same key is not found, the filtering counter begins to count down, from three to two in one scanning cycle and from two to one in the next scanning cycle. Following that, the key contacts again close for one cycle permitting the same key to be found and causing the filtering counter to count up from one to two. When the key contacts again open for a number of cycles, the filtering counter counts to zero. That resets the KEY ACTIVE signal. In that manner, any subsequent bounce of the contacts of the key just released are prevented from causing a double entry of the same key.

In this case of graph D, a subsequent trailing bounce is illustrated for two cycles permitting the filtering counter to count up from zero to two, and then count back down to zero again. If the key contacts had remained closed for one more cycle, the count of three would have been reached in the filtering counter to again generate a SET KEY ACTIVE signal. From that it can be readily appreciated that the filtering time (maximum count of the filtering counter) selected should be greater than the maximum bounce contact possible with a given keyboard. That can be determined empirically.

Graph E of FIG. 5 illustrates another trailing bounce possibility After the key is released, and the counter counts down through two scanning cycles from three to one, the key contacts again close for an extended period allowing the filtering counter to count back up to the maximum selected count of three. Following that, the key contacts open for an indefinite period and the filtering counter counts down to zero to reset the KEY ACTIVE signal. Although the key bounce was for more than three cycles, double entry of the same key does not result because after releasing the key, the key contacts did not open for a sufficient period to allow the filtering counter to reset the KEY ACTIVE signal before the key bounce permitted the filtering counter to again count to the maximum count of three.

The manner in which the filtering counter permits proper entry of two keys depressed in overlapping time will now be described with reference to FIG. 6. In graph A, two keys, K1 and K2, are shown depressed in sequence in a normal manner with an intervening period between keys greater than the filtering time of the filter counter such that for the first key, the filtering counter counts up to three to set the KEY ACTIVE signal, and then counts down to zero to reset the KEY ACTIVE signal, thereby permitting the second key to be entered in the same normal manner.

Figure 6:
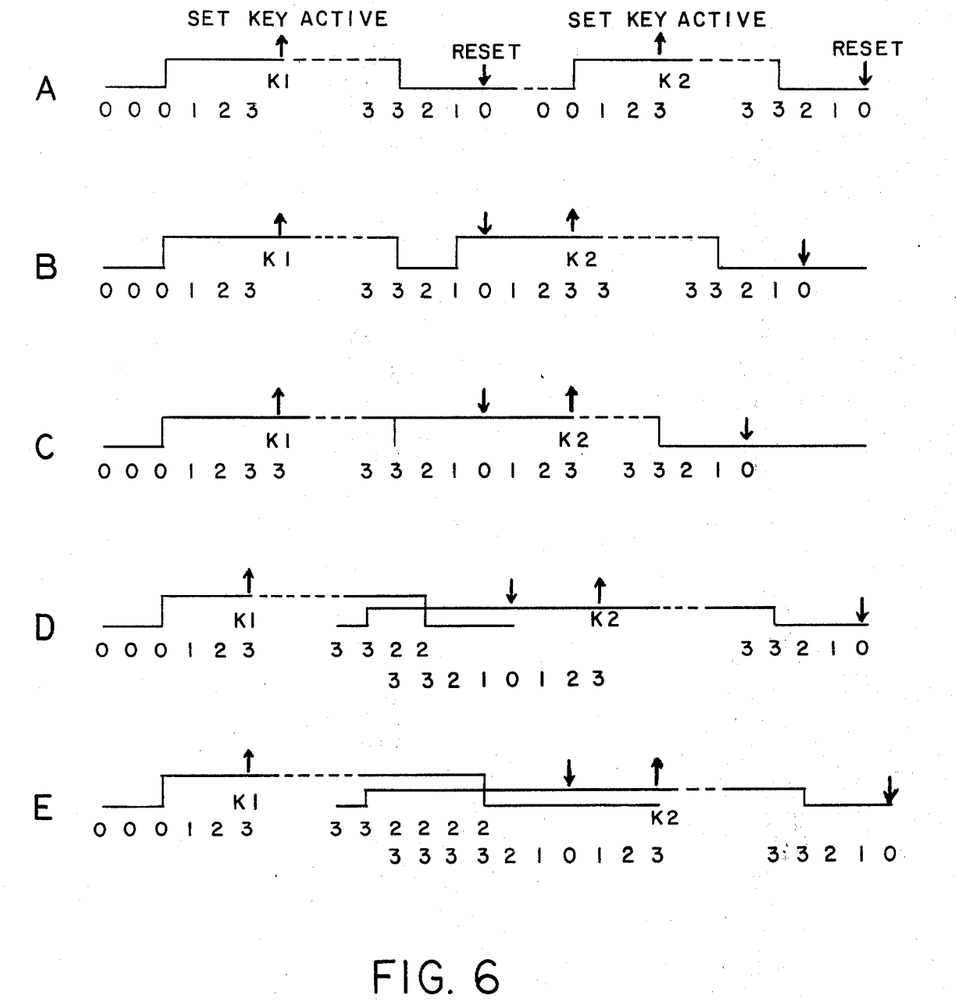
FIG. 6 shows graphs that illustrate the rollover capability of a scanner-filter operating in accordance with the present invention.

Graph B of FIG. 6 illustrates two keys depressed in succession without overlapping, but with an intervening period less than the filter time of the counter such that, when the first key is released, the counter begins to count to zero. Before reaching the count of zero, the second key is depressed, but since the first key number remains in the buffer 33 until the filtering counter reaches zero, the key number of the second key does not compare with the content of the buffer. Consequently the filtering counter continues to count down even though a KEY DETECT signal is generated by the scanning section (FIG. 3) for the second key. Once the filtering counter reaches zero, the key number of the second key depressed is entered in the buffer. Thereafter, the filtering counter is incremented each time the second key is found to again set the KEY ACTIVE signal for the second key. This clearly illustrates that the filtering function at the trailing end of a key does not interfere with the filtering and entry of a subsequent key. The intervening period between two successive keys may even decrease to zero, as shown in graph C, and still permit the second key to be filtered and entered as before.

If the second key is depressed in overlapping time, as shown in graph D of FIG. 6, the first key is entered and filtered in the usual manner at both the leading and trailing edge. When the first key is released, the filtering counter begins to count to zero and even though the second key has been depressed, thus causing two key detect signals to be generated during each scanning cycle, the filtering counter will not, in effect, start counting down to zero until the first key is released because when the KEY DETECT signal for the second key is generated in each scanning cycle, the key number of the second key is compared with the key number of the first key in the buffer 33. Since they do not compare, the filtering counter is caused to count down, but following that the KEY DETECT signal for the first key will cause the key number of the first key to be compared with its number in the buffer and thus cause the filtering counter to count back up to the maximum count of three. This toggling between the count of three and the count of two will continue until the first key is released. Then for each subsequent cycle, a KEY DETECT signal is generated for only the second key to cause the number of the second key to be compared with the number of the first key in the buffer register. Since they do not compare, the filtering counter is caused to count down. Once the count of zero is reached, the key number of the second key is entered in the buffer register as though it had just then been depressed. After three subsequent scanning cycles during which the same key is found, the filtering counter counts up to the maximum count of three to set the KEY ACTIVE signal for the second key.

This overlapping of two keys may be for an even greater period than illustrated in graph D of FIG. 6 as shown in graph E. The only restriction on overlapping is that the second key not be depressed before a KEY ACTIVE signal has been set for the first key. This means that the first key must be depressed and sufficient time allowed for any key bounce to be filtered before the second key is depressed. If the second key is depressed too close after the first key, the two keys will each produce a KEY DETECT signal during each scanning cycle. Consequently the filtering counter will toggle (count up one and down one during each cycle) and never reach the maximum count of three until the first key is released. The filtering counter then counts down to zero and the first key is lost. If the second key is still depressed at that time, its key number is transferred into the buffer and the filtering counter will start counting up to set KEY ACTIVE for the second key. The second key is thus entered while the first key is lost. Such a keying error is unlikely because if the second key is depressed so soon after the first as to cause the first to be lost, it would not be possible under normal operation for even the fastest keyboard operator to have separately operated the two keys. Instead it would be more likely that the operator has depressed two adjacent keys at substantially the same time, in which case the two keys would also be released at substantially the same time. In that case neither key is entered due to filtering both the leading and the trailing ends of the key operations.

The contacts of a second key separately depressed may bounce, but overlapping of the second key bounce with the first key will not interfere with the two-key rollover capability just described with reference to FIG. 6. The overlapping key bounce will merely cause the filtering counter to toggle between the counts of three and two until the overlapping ceases either because the contacts of the second key have opened while the contacts of the first key remain closed, in which case the situation is as though only the first key had been depressed to that time, or the contacts of the first key open while the contacts of the second key remain closed, in which case filtering proceeds as though only the second key had been depressed. Thus, if the key contacts of the first key open before the key bounce of the second key terminates, the situation is the same as for depressing two keys in overlapping time. Once the filtering counter counts down to zero because the first key has been released for three scanning cycles, filtering of the second key commences. If that filtering of the second key commences during a leading key bounce of the second key, then the situation is as though there were a short key bounce, too short for the KEY ACTIVE signal to be set. If the contacts of the first key bounce when the first key is released, the result will be simply that resetting KEY ACTIVE will be delayed until after the trailing key bounce of the first key. If at that time the contacts of the second key have settled, KEY ACTIVE will be set in three scanning cycles once the filtering counter reaches the count of zero following the last key bounce of the first key. If the last key bounce of the first key terminates during a leading key bounce of the second key, the result will be simply that filtering of the key bounce of the second key is delayed until the filtering counter reaches zero following the last bounce of the first key.

What is claimed is:

1. In a data processing system including a central processing unit and a peripheral device having a keyboard through which an operator may key in data by momentarily closing key contacts of individual keys as they are depressed, apparatus for coupling said keyboard to said central processing unit comprising
    means for continually scanning said contacts of individual keys of said keyboard in search of closed contacts indicating a key has been depressed,
    means for storing a unique code representative of a key found depressed during a given scanning cycle following at least a predetermined number of scanning cycles during which no depressed key is found,
    means for comparing a unique code representative of a key found depressed during each scanning cycle following said given scanning cycle,
    counting means responsive to said comparing means for counting up each cycle that the unique code of a key found corresponds to the unique code stored in said storing means up to said predetermined number of cycles and maintaining said number as a maximum count so long as the key found continues to correspond, and for counting down each cycle that no key is found depressed or that the unique code of a key found does not correspond to the unique code stored in said storing means, and
    means responsive to said counting means for initiating transfer of said unique code to said central processing unit when said predetermined number is reached as a maximum count.

2. Apparatus as defined in claim 1 wherein said predetermined number is selected in response to at least one filter control signal, and including means for storing said filter control signal.

3. Apparatus as defined in claim 2 wherein said scanning means is comprised of a free running counter operating in response to clock pulses, whereby the unique code representative of a key found corresponds to the state of the counter, and including means for selecting the rate at which said clock pulses are effective to operate said free running counter in response to at least one rate control signal and means for storing said rate control signal.

4. Apparatus as defined in claim 3 wherein said means for initiating transfer of said unique code to said central processing unit is comprised of means responsive to said counting means for originating an interrupt request when said predetermined number is reached as a maximum count.

5. Apparatus for automatically scanning a keyboard for the purpose of detecting depressed keys in the order depressed and presenting a key identifying code to a data processing system without double detection and identification of a single depressed key due to bouncing key contacts, comprising means for automatically and cyclically scanning all key contacts in search of closed key contacts and for identifying each with a unique key code corresponding to the position in the scan cycle that key contacts are detected closed, means for signalling to said data processor when a depressed key has been found and identified, and means for filtering out any bounce in key contacts closing before actuating said signalling means upon a key being depressed including means for counting up to a predetermined number of scan cycles the same key contacts are detected closed and counting down each scan cycle the same key contacts are not detected closed before actuating said signalling means.

6. Apparatus as defined in claim 5 wherein said filtering means includes means for picking up the detection of first and second keys of two successive keys depressed for filtering and picking up the second only when said counting means has counted down to zero in response to said predetermined number of scan cycles the first key is not found depressed, thereby detecting and identifying separately two keys depressed even though the second is depressed.

7. Apparatus as defined in claim 6 wherein said means for picking up the detection of said first and second keys includes means for storing the unique code identifying key contacts detected closed during one cycle for comparison with codes identifying contacts detected closed during subsequent cycles, and means for replacing the stored code with the unique code of another depressed key only when said up-down counting means has counted down to zero.

8. Apparatus as defined in claim 7 including means for causing a predetermined key identifying code to be stored in said storing means when contacts of that key are scanned and not detected closed, and said up-down counter has counted down to zero, thereby resetting said storing means to said predetermined key identifying code.

9. Apparatus as defined in claim 8 wherein said scanning means is comprised of a free running counter operating in response to clock pulses, whereby the unique code identifying a key found corresponds to the state of the counter.

10. Apparatus as defined in claim 9 wherein said signalling means is comprised of means responsive to said up-down counting means for originating an interrupt request when said predetermined number is reached upon counting up cycles the same key contacts are detected closed.

* * * * *